(12) United States Patent
Carter et al.

(10) Patent No.: US 6,809,472 B1
(45) Date of Patent: Oct. 26, 2004

(54) LIGHT-EMITTING DEVICES

(75) Inventors: Julian Carter, Dry Drayton (GB); Stephen Karl Heeks, Cottenham (GB)

(73) Assignee: Cambridge Display Technology Limited, Cambridge (GB)

( * ) Notice: Subject to any disclaimer, the term of this patent is extended or adjusted under 35 U.S.C. 154(b) by 149 days.

(21) Appl. No.: 10/009,079

(22) PCT Filed: Jun. 1, 2000

(86) PCT No.: PCT/GB00/02121
§ 371 (c)(1), (2), (4) Date: Apr. 29, 2002

(87) PCT Pub. No.: WO00/76009
PCT Pub. Date: Dec. 14, 2000

(30) Foreign Application Priority Data

Jun. 9, 1999 (GB) .............................................. 9913449

(51) Int. Cl.$^7$ .................................................. H01J 1/62
(52) U.S. Cl. ...................................... 313/504; 313/503
(58) Field of Search ................................ 313/504, 503, 313/506, 346 R, 498, 507; 127/152, 431, 89; 428/457

(56) References Cited

U.S. PATENT DOCUMENTS

| | | | |
|---|---|---|---|
| 4,539,507 A | 9/1985 | VanSlyke et al. ........... | 313/504 |
| 5,059,862 A | * 10/1991 | VanSlyke et al. ........... | 313/503 |
| 6,392,250 B1 | * 5/2002 | Aziz et al. ..................... | 257/40 |

FOREIGN PATENT DOCUMENTS

| | | |
|---|---|---|
| EP | 0 278 757 A2 | 8/1988 |
| EP | 0 563 009 A1 | 9/1993 |
| EP | 0 704 912 A1 | 4/1996 |
| JP | 11-111461 | 4/1999 |
| WO | WO 90/13148 | 11/1990 |
| WO | WO 96/26830 | 9/1996 |
| WO | WO 96/29747 | 9/1996 |

OTHER PUBLICATIONS

"Aluminum Based Cathode Structure for Enhanced Electron Injection Inelectroluminescent Organic Devices", Jabbour et al., Applied Physics Letters, U.S. American Institute of Physics, vol. 73, No. 9, Aug. 31, 1998, pp. 1185–1187.
Search Report from Great Britain Patent Office for Application No. GB 9913449.6 dated Oct. 4, 1999.
International Search Report in PCT/GB00/02121 dated Sep. 12, 2000.
International Preliminary Examination Report in PCT/GB00/02121 dated Sep. 17, 2001.

* cited by examiner

Primary Examiner—Nimeshkumar D. Patel
Assistant Examiner—Ken A Berck
(74) Attorney, Agent, or Firm—Marshall, Gerstein & Borun LLP

(57) ABSTRACT

An electroluminescent device including: a first electrode; a second electrode; and a light-emissive region of electroluminescent organic material between the electrodes; and wherein the first electrode includes a first material capable of injecting positive charge carriers into the light-emissive region and a second material capable of injecting negative charge carriers into the light-emissive region; and the second electrode inlcueds a third material capable of injecting positive charge carriers into the light-emissive region and a fourth material capable of injecting negative charge carriers into the light-emissive region.

16 Claims, 3 Drawing Sheets

LIGHT-EMITTING DEVICES

This is the U.S. national phase of International Application No. PCT/GB00/02121 filed Jun. 1, 2000, the entire disclosure of which is incorporated herein by reference.

This invention relates light-emitting devices, for example devices suitable as display devices.

One specific class of display devices is those that use an organic material for light emission. Light-emitting organic materials are described in PCT/WO90/13148 and U.S. Pat. No. 4,539,507, the contents of both of which are incorporated herein by reference. The basic structure of these devices is a light-emitting organic layer, for instance a film of a poly(p-phenylenevinylene ("PPV"), sandwiched between two electrodes. One of the electrodes (the cathode) injects negative charge carriers (electrons) and the other electrode (the anode) injects positive charge carriers (holes). The electrons and holes combine in the organic layer generating photons. In PCT/WO90/13148 the organic light-emitting material is a polymer. In U.S. Pat. No. 4,539,507 the organic light-emitting material is of the class known as small molecule materials, such as (8-hydroxyquinoline) aluminium ("Alq3"). In a practical device one of the electrodes is typically transparent, to allow the photons to escape the device.

FIG. 1 shows the typical cross-sectional structure of an organic light-emitting device ("OLED"). The OLED is typically fabricated on a glass or plastic substrate 1 coated with a transparent anode electrode 2 of a material such as indium-tin-oxide ("ITO") that is suitable for injecting positive charge carriers. Such coated substrates are commercially available. This ITO-coated substrate is covered with at least a layer of a thin film of an electroluminescent organic material 3 and a final layer forming a cathode electrode 4 of a material that is suitable for injecting negative charge carriers. The cathode electrode is typically of a metal or alloy. Other layers can be included in the device, for example to improve charge transport between the electrodes and the electroluminescent material.

FIG. 2 shows the energy levels of the layers in the device of FIG. 1. Under forward bias it is feasible for holes to pass from the anode electrode 2 and for electrons to pass from the cathode electrode 4 into the emitting layer, where they can combine. Under reverse bias it is not favourable for electrons to pass from the electrode 2 into the emitting layer, or for holes to pass from the electrode 4 into the emitting layer 2. The device thus behaves as a diode.

Important measures of the performance of OLEDs are lifetime, power efficiency and turn-on voltage. It has been recognised that the lifetime of a typical OLED can often be extended by driving it intermittently or even by applying temporary reverse voltages between the anode and cathode electrodes (AC driving). However, since no light is emitted when there a negative applied voltage an AC drive scheme reduces light output from the OLED unless the device is driven harder during the times when it is under forward bias. This harder driving can a accelerate degradation of the device. In some circumstances this can significantly offset any gains in lifetime from intermittent or AC driving.

According to the present invention there is provided an electroluminescent device comprising: a first electrode; a second electrode; and a light-emissive region of electroluminescent organic material between the electrodes; and wherein the first electrode comprises a first material capable of injecting positive charge carriers into the light-emissive region and a second material capable of injecting negative charge carriers into the light-emissive region; and the second electrode comprises a third material capable of injecting positive charge carriers into the light-emissive region and a fourth material capable of injecting negative charge carriers into the light-emissive region.

Preferably the device is capable of emitting light from the light-emissive region when the said negative charge carriers are injected from the first electrode and positive charge carriers are injected from the second electrode and is capable of emitting light from the light-emissive region when the said positive charge carriers are injected from the first electrode and negative charge carriers are injected from the second electrode.

Preferably the first, second third and fourth materials are capable of injecting charge carriers as said above when a voltage of magnitude less than 20, 10 or 5V is applied between the electrodes. One or both of the first and third materials may have a work function above 4.0 eV or 4.5 eV. One or both of the second and fourth materials may have a work function below 3.5 eV or 3.0 eV.

The first electrode suitably has a surface facing the region of electroluminescent material at which the first material and the second material are present. Preferably regions of the first and second materials are located adjacent to the region of electroluminescent material. The second electrode suitably has a surface facing the region of electroluminescent material at which the third material and the fourth material are present. Preferably regions of the third and fourth materials are located adjacent to the region of electroluminescent material.

The first and/or third material may, for example, be gold or platinum or ITO. The first and third materials may be the same or different. The second and/or fourth material may, for example, be an alkali metal or and alkali earth metal or an oxide or fluoride of an alkali metal or an alkali earth metal, suitably having a low work function—for example below 3.5 eV. The second and/or fourth material may be a fluoride or oxide of a low work function metal such as Li, Ca, Mg, Cs, Ba, Yb, Sm etc. The second and/or fourth materials may be the same or different.

Preferably either or both of the electrodes may be light-transmissive, most preferably transparent.

According to a second aspect of the present invention there is provided a method of driving an electroluminescent device as described above, comprising applying an alternating current drive scheme to the electrodes. The alternating current drive scheme may comprise repeatedly biasing the first electrode positively relative to the second electrode and subsequently biasing the first electrode negatively relative to the second electrode. The scheme may or may not be periodic. The scheme may or may not include periods when neither electrode is biased relative to the other.

Where the device is driven by a scheme that includes periods of opposite biasing it is preferred that the voltage applied across the electrodes when the first electrode is biased positively relative to the second electrode is such as to cause electron/hole recombination in a different zone of the light-emissive region than does the voltage applied across the electrodes when the first electrode is biased negatively relative to the second electrode.

The light-emitting material is suitably an organic material and preferably a polymer material. The light-emitting material is preferably a semiconductive and/or conjugated polymer material. Alternatively the light-emitting material could be of other types, for example sublimed small molecule films or inorganic light-emitting material. The or each organic light-emitting material may comprise one or more individual organic materials, suitably polymers, preferably fully or partially conjugated polymers. Example materials include one or more of the following in any combination: poly(p-phenylenevinylene) ("PPV"), poly(2-methoxy-5(2'-ethyl)hexyloxyphenylenevinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene)-(1,4-phenylene-(4-secbutylphenyl)imino)-1,4-phenylene)) ("TFB"), poly(2,7-(9,9-di-n-octylfluorene)-(1,4-phenylene-((4-methylphenyl) imino)-1,4-phenylene-((4-methylphenyl)imino)-1,4-phenylene)) ("PFM"), poly(2,7-(9.9-di-n-octylfluorene)-(1,4-phenylene((4-methoxyphenyl)imino)-1,4-pherylene-((4-methoxyphenyl)imino)-1,4-phenylene)) ("PFMO"), poly (2,7-(9,9-di-n-octylfluorene) ("F8") or (2,7-(9,9-di-n-octylfluorene)-3,6-Benzothiadiazole) ("F8BT"). Alterative materials include small molecule materials such as. Alq3. The light-emitting region may include two or more such materials.

One or more charge-transport layers may be provided between the light-emitting region and one or both of the electrodes, or integrated into the light-emitting region. The or each charge transport layer may suitably comprise one or more polymers such as polystyrene sulphonic acid doped polyethylene dioxythiophene ("PEDOT-PSS"), poly(2,7-(9, 9-di-n-octylfluorene)-(1,4-phenylene-(4-imino(benzoic acid))-1,4-phenylene-(4-imino(benzoic acid))-1,4-phenylene)) ("BFA"), polyaniline and PPV.

The present invention will now be described by way of example with reference to the accompanying drawings, in which.

Figure 1:
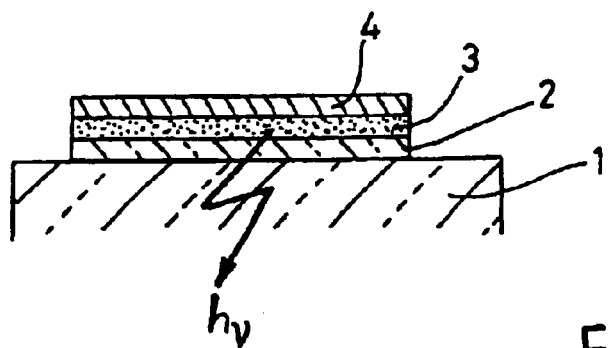
FIG. 1 shows a typical cross-sectional structure of an organic light-emitting device ("OLED")
Figure 2:
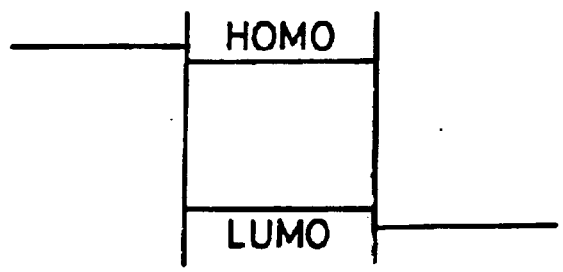
FIG. 2 shows the energy levels of the layers in the device of FIG. 1.
Figure 3:
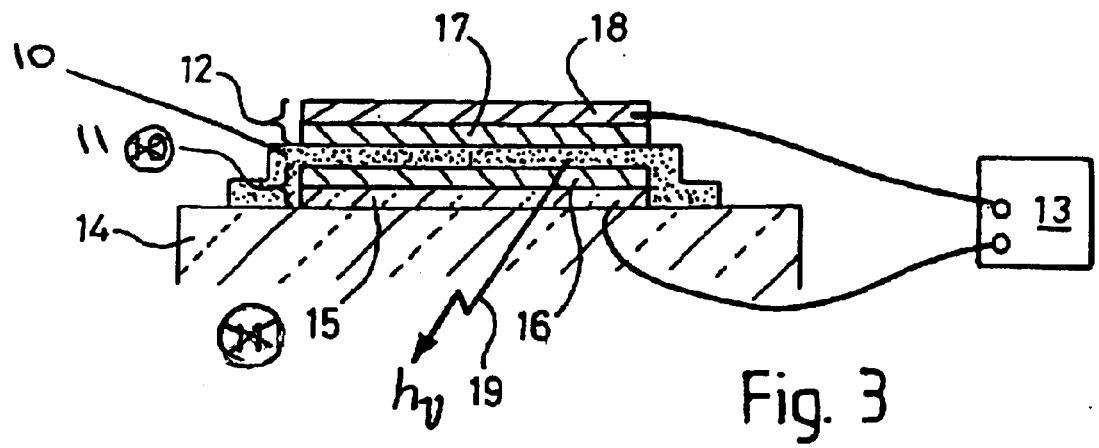
FIG. 3 is a cross-section of a light-emitting device in accordance with the invention.

The device of FIG. 3 comprises a region 10 of light-emissive material located between two electrode structures 11 and 12. The electrode structures are a connected to a drive unit 13 which is capable of applying a voltage between the electrode structures. The electrode structures are formed so as to be capable of allowing relatively efficient emission from the light-emissive material whether electrode structure 11 is the anode (and therefore electrically positive relative to electrode structure 12) or the cathode (and therefore electrically negative relative a to electrode structure 12).

The device of FIG. 3 is formed on a glass substrate 14 which is coated with a contact layer 15 of indium-tin oxide (ITO). Such ITO-coated glass substrates are commercially available. The glass sheet could be a sheet of sodalime or borosilicate glass of a thickness of, for instance, 1 mm. Instead of glass other materials such as Perspex could be used. The thickness of the ITO coating is suitably around 150 nm and the ITO suitably has a sheet resistance of between 10 and 30 Ω/□, preferably around 15 Ω/□.

Over the ITO layer 15 is deposited a charge injection layer 16 of Au and LiF. This layer could be formed by co-evaporation of the Au and LiF. The thickness of layer 15 is suitably between 2 and 20 nm, preferably around 5 nm. A suitable Au:LiF ratio—for example 1:1—is selected. The microstructure of the Au:LiF layer is selected to achieve the desired bi-directional device performance (for which the high and low work-function components should preferably exhibit their bulk properties at the interfaces with the emissive material) together with adequately uniform emission at the expected viewing distance of the device. A device that is intended to be viewed from short range may need the electrodes to have a finer microstructure than can be tolerated in one that is intended to be viewed from long range.

Then light-emissive material is deposited to form region 10. The light-emissive material could be any suitable light-emissive polymer, small molecule or oligomer material or the like, or a mixture of two or more of such materials together optionally with other materials. The layer could be formed by substituted poly(p-phenylenevinylene) polymers. This is deposited on top of layer 2 by spin-coating from an organic solvent The light-emissive material may be mixed with components that assist charge transport within the light-emissive region. The thickness of the layer of light-emissive material is suitably around 90 nm.

The electrode 12 comprises a second charge injection layer 17 of Au and LiF, which could again be deposited by co-evaporation of those components. The thickness of the layer 17 is suitably around 20 nm.

Over the charge injection layer 17 is a second contact layer 18 of Al, which could be deposited by evaporation. The thickness of the layer 18 is suitably around 500 nm.

After the layer 18 has been deposited the contacts are made to the layers 15 and 18 and the device is encapsulated in epoxy-glass for environmental protection.

Electrode structure 11 comprises layers 15 and 16. Electrode structure 12 comprises layers 17 and 18.

Each of the charge injection layers 16 and 17 comprises a material of a relatively high work function (Au) and a material of a relatively low work function (LiF). The microstructure of the layers is such that those materials are present throughout the layers, and especially at the surface of each of the layers that is adjacent the light-emissive region. As a result of this the charge injection layers can operate to inject charge relatively efficiently whether they are the anode or the cathode of the device during use. The electrically conductive contact layers 15 and 18 act as an interface to the connectors to the drive unit 13 and help to distribute charge evenly over the charge injection layers. The charge injection layers 16 and 17 could include further high or low work function components and/or components to increase electrical conductivity through the layers.

In the embodiment of FIG. 3 the substrate 14, contact layer 15 and injection layer 16 are light-transmissive and preferably transparent so that light can leave the device through the substrate. (See arrow 19). In other devices the other electrode structure 12 could be light transmissive, or light could be emitted through the sides of the device.

Figure 4:
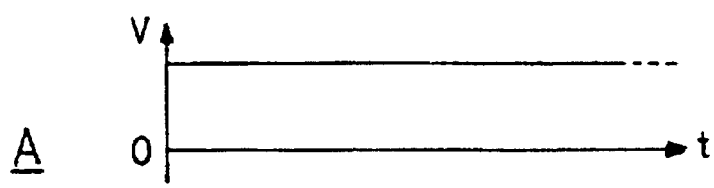
FIGS. 4 and 5 illustrate schemes for driving the device of FIG. 3.
Figure 4:
Figure 4:
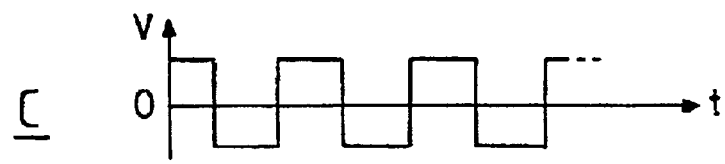
Figure 4:
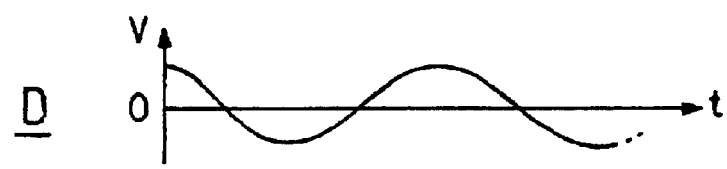
Figure 4:
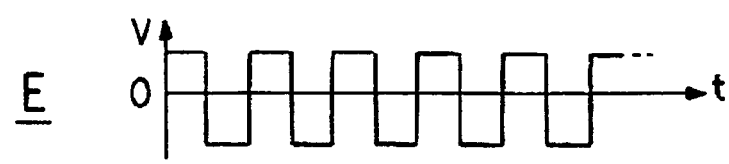
Figure 4:
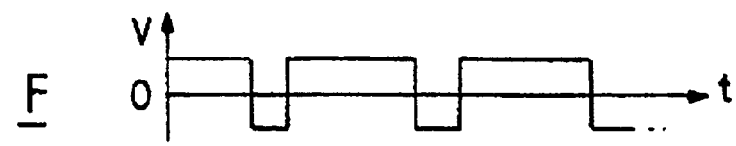
Figure 4:
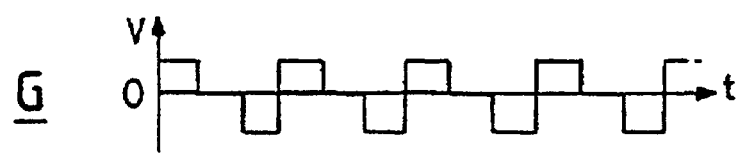

FIG. 4 shows examples of schemes that can be used to drive the device of FIG. 3. FIG. 4 shows a series of schematic plots of applied voltage between the layers 15 and 17 against time.

Scheme A shows the application of a constant voltage whereby the layer 15 is maintained at a higher potential (positive) than layer 17. In this case the electrode structure 11 acts as the anode and the electrode structure 12 acts as the cathode. The electrode 11 injects holes into the light-emitting material by means of the high work function Au component of layer 16. The electrode 12 injects electrons into the light-emitting material by means of the low work function LiF component of layer 17.

Scheme B shows the application of a constant voltage whereby the layer 15 is maintained at a lower potential (negative) than layer 17. In this case the electrode structure 11 acts as the cathode and the electrode structure 12 acts as the anode. The electrode 11 injects electrons into the light-emitting material by means of the low work function LiF component of layer 16. The electrode 12 injects holes into the light-emitting material by means of the high work function Au component of layer 17.

The device can thus operate relatively efficiently under forward and reverse bias (schemes A and B). It can also operate under alternating current (AC) drive schemes, examples of which are given in schemes C to G. It is believed that AC drive schemes may offer a number of advantages over direct current (DC) drive schemes. One reason for the failure of OLEDs is migration of components of the device towards one of the electrodes under an applied field of a constant direction. An AC scheme can address this problem by inducing migration in the opposite direction when a reverse field is applied. In addition, in some circumstances it may be more convenient for hardware reasons to drive an OLED by AC.

Scheme C is a simple square wave alternating current drive scheme in which the positive and negative sections of the scheme are of equal period and voltage.

Scheme D is a simple sine wave alternating current drive scheme in which the positive and negative sections of the scheme are of equal period and voltage.

The scheme need not be symmetrical. Scheme E is a square wave scheme in which the positive and negative sections of the scheme are of different levels. This scheme may be useful if the device emits more efficiently under on bias than under the other since the brightness of the device may then be maintained constant by means of this scheme. Scheme F is a square wave scheme in which the positive and negative sections of the scheme are of different durations. This scheme may be useful if migration is greater under one bias than under the other.

Scheme G in FIG. 4 includes periods of zero voltage.

The drive scheme need not be periodic: it could be random.

Figure 5:
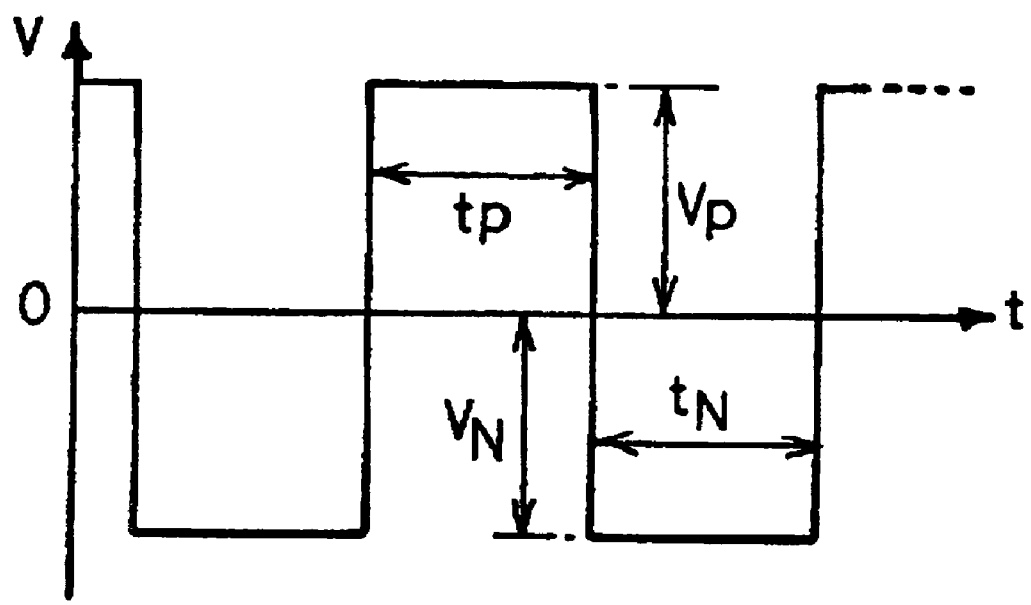

When a device as described above is driven by an AC drive scheme further improvements in lifetime may be achieved by an additional mechanism. It is believed that in a conventional device degradation of the light-emissive material is greatest in the region of the material where electron/hole recombination occurs. This is in a fixed zone of the material for a given brightness. When the device of FIG. 3 is operated in reverse recombination is likely to occur in a different zone. Therefore, in the device of FIG. 3 degradation can be distributed more evenly throughout the light-emissive region. FIG. 5 shows a generalised periodic square wave drive scheme. By varying $V_P$, $V_N$, $t_P$ and $t_N$ the scheme can result in a desired brightness, with the recombination/degradation zones in different locations.

One of the materials of each charge injecting layer suitably has a work function that is close to the LUMO level of the light-emitting material. One of the materials of each charge injecting layer suitably has a work function that is dose to the HOMO level of the light-emitting material. For typical organic light-emissive materials it is preferred that one of the materials of each charge injection layer has a work function that is greater than 4.0, 4.1, 4.2, 4.3, 4.4 or 4.5 eV or is higher than 4.5 eV, and/or that another of the materials of each charge injection layer has a work function that is less than 3.5, 3.4, 3.3, 3.2, 3.1 or 3.0 eV or is lower than 3.0 eV. The charge injection layers may have the same or different compositions.

There may be one or more charge transport layers between either or both of the electrodes and the emissive layer. The charge transport layers may be of an electrically conductive organic material such as polystyrene sulphonic acid doped polyethylene dioxythiophene ("PEDOT-PSS").

The device could form part of a larger display unit having a number of independently controllable display elements or pixels. The pixels could be of the same or different shapes. The pixels could be addressed by any suitable addressing schemes, including active and passive matrix addressing.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

What is claimed is:

1. An electroluminescent device comprising:
   a first electrode;
   a second electrode; and
   a light-emissive region of electroluminescent organic material between the electrodes;
   wherein the first electrode comprises a first material capable of injecting positive charge carriers into the light-emissive region and a second material capable of injecting negative charge carriers into the light-emissive region; and
   the second electrode comprises a third material capable of injecting positive charge carriers into the light-emissive region and a fourth material capable of injecting negative charge carriers into the light-emissive region.

2. An electroluminescent device as claimed in claim 1, wherein the first electrode has a surface facing the region of electroluminescent material and the first material and the second material are present at that surface.

3. An electroluminescent device as claimed in claim 1, wherein the second electrode has a surface facing the region of electroluminescent material and the third material and the fourth material are present at that surface.

4. An electroluminescent device as claimed in claim 1, wherein the first electrode is formed by co-depositing the first and second materials.

5. An electroluminescent device as claimed in claim 1, wherein the second electrode is formed by co-depositing the third and fourth materials.

6. An electroluminescent device as claimed in claim 1, wherein at least one of the first and second electrodes is light-transmissive.

7. An electroluminescent device as claimed in claim 1, wherein at least one of the first and third materials is gold or platinum.

8. An electroluminescent device as claimed in claim 1, wherein at least one of the second and fourth materials is an alkali metal or an alkali earth metal or an oxide or fluoride of an alkali metal or an alkali earth metal.

9. An electroluminescent material as claimed in claim 1, wherein at least one of the first and third materials has a work function above 4.0 eV.

10. An electroluminescent material as claimed in claim 1, wherein at least one of the second and fourth materials has a work function below 3.5 eV.

11. An electroluminescent device as claimed in claim 1, wherein the first and third materials are the same.

12. An electroluminescent device as claimed in claim 1, wherein the second and fourth materials are the same.

13. An electroluminescent device as claimed in claim 1, comprising a drive unit electrically connected to the first and second electrodes for applying an alternating current drive scheme to the electrodes.

14. An electroluminescent device as claimed in claim 1, comprising a charge transport layer of an electrically conductive material between at least one of the electrodes and the light-emissive region.

15. A method of driving an electroluminescent device as claimed in claim 1, comprising applying an alternating current scheme to the electrodes.

16. An electroluminescent device as claimed in claim 2, wherein the second electrode has a surface facing the region of electroluminescent material and the third material and the fourth material are present at that surface.

* * * * *